US006369652B1

United States Patent
Nguyen et al.

(10) Patent No.: US 6,369,652 B1
(45) Date of Patent: Apr. 9, 2002

(54) DIFFERENTIAL AMPLIFIERS WITH CURRENT AND RESISTANCE COMPENSATION ELEMENTS FOR BALANCED OUTPUT

(75) Inventors: Huy M. Nguyen; Benedict C. Lau; Roxanne T. Vu, all of San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/571,089

(22) Filed: May 15, 2000

(51) Int. Cl.⁷ .............................................. H03F 3/45
(52) U.S. Cl. ...................................... 330/253; 330/261
(58) Field of Search ................................. 330/253, 254, 330/256, 261; 327/52; 365/207, 208

(56) References Cited

U.S. PATENT DOCUMENTS

| | | | | |
|---|---|---|---|---|
| 4,939,478 A | * | 7/1990 | Heimsch et al. ............. 330/253 |
| 4,963,835 A | * | 10/1990 | Saitoh ......................... 330/253 |
| 5,142,168 A | * | 8/1992 | Matsunuga ................... 330/253 |
| 5,319,755 A | | 6/1994 | Farmwald et al. ........... 395/325 |
| 5,821,824 A | * | 10/1998 | Mentzer ........................ 327/52 |
| 5,977,798 A | | 11/1999 | Zerbe ............................. 326/98 |
| 6,002,276 A | * | 12/1999 | Wu ............................. 330/253 |
| 6,072,366 A | * | 6/2000 | Maeda et al. ................ 330/254 |
| 6,118,340 A | * | 9/2000 | Koen ........................... 330/253 |
| 6,125,157 A | | 9/2000 | Donnelly et al. ............ 375/371 |

* cited by examiner

Primary Examiner—Robert Pascal
Assistant Examiner—Khanh Van Nguyen
(74) Attorney, Agent, or Firm—Mark Lauer

(57) ABSTRACT

A differential amplifier has unequal resistance in its legs that compensates for an unequal current flow through the legs during a logic zero data input compared to logic one data input. The unequal resistance may be provided by adding a resistor in parallel to the leg that carries greater current during amplification, lowering the resistance in that leg and also the voltage that is output from that leg. Alternatively, a variable resistance may be provided to at least one of the legs to compensate for current inequalities between the legs. The variable resistance may be provided by a transistor that is controlled by a signal indicating process, voltage and/or temperature conditions of the amplifier and adjacent circuitry. Transistors may be employed in both legs as well as in a current source for the amplifier, providing balanced current regulation for the amplifier. Such current compensated differential amplifiers may be employed for various functions, for example as input receivers or delay elements in high frequency memory systems.

29 Claims, 4 Drawing Sheets

DIFFERENTIAL AMPLIFIERS WITH CURRENT AND RESISTANCE COMPENSATION ELEMENTS FOR BALANCED OUTPUT

BACKGROUND

The present invention relates to differential amplifier circuitry, and in particular to differential amplifier circuitry for low voltage amplification.

Differential amplifiers are well-known electronic devices for amplifying a voltage difference between two input signals. The input signals are provided to a pair of transistor gates of such an amplifier, each of which regulates a larger voltage and current swing through a corresponding leg of the amplifier. The legs are independently connected to a voltage source at one end, each leg including a resistor located between the transistor and voltage source, and are together connected to a voltage or current source at an opposite end. An output signal is taken from each leg between its transistor and resistor. The transistor and resistor of each leg are designed to be matched with those of the other leg, so that any difference in voltage between the input signals generates an amplified difference in voltage between the output signals. An advantage of such a differential amplifier is that the matched pair cancels undesirable voltage swings common to input signals, which may for instance be caused by temperature variations or noise, whereas differences between the input signals are amplified.

FIG. 1 shows a prior art MOS differential amplifier 21 that may be used as a receiver for a memory unit. Similar input receivers are disclosed in U.S. Pat. No. 5,319,755 and in U.S. Pat. No. 5,977,798, which are incorporated by reference herein. First and second lines 20 and 22 having matched resistors and transistors are connected to a voltage source Vdd and current source 10. A reference signal VREF, which has an essentially constant voltage, is input to one transistor and a data signal DATA that varies about VREF is input to the other transistor, a system sometimes termed a single-ended data receiver. Typically the input data signal swings a few volts above and below the input reference signal. When the input data signal voltage is higher than the input reference signal voltage, current flows through line 20 so that an amplified voltage OUT0 is output on line 25. When the input data signal voltage is lower than the reference signal voltage, current flows through line 22 so that an amplified voltage OUT_0 is output on line 28. The output lines 25 and 28 may be fed to a latch stage where they are clocked and stored.

To operate at higher frequencies with less power consumption, it may be desirable for the input data signal to swing by a smaller amount and to maintain lower voltage at source Vdd. With a low voltage Vdd and low input data signal swings, however, several problems may occur. Variations in rise and fall times of the output data signal make centering of the clock signal on the output data signal challenging. Setup and hold times or their tolerances might be adjusted but this has other costs and becomes more difficult at higher frequencies. Output data signals may not be equally amplified for high and low input data swings, so that a full rail voltage is not achieved for both high and low output data swings, causing errors in reading the data at both rising and falling edges.

In addition, high frequency memory devices such as those described in the above-referenced patents may employ a clocking compensation scheme including a delay locked loop (DLL), for which an input receiver setup time is matched with a clock loop phase detector setup time. For differential clock and single-ended data signals of similar amplitude, however, the differential clock may have virtually double the gain as the input receiver, so that the phase detector setup time is less than that of the input receiver.

Conventional MOS current source 10 is shown in more detail in FIG. 2, and corresponding voltage and current characteristics of that current source 10 are illustrated in FIG. 3. The differential pair lines 20 and 22 are represented as a single variable potential V0. Transistor 30 has its gate held at a fixed voltage, which puts the transistor in a saturated mode for a gate-source voltage exceeding the threshold voltage of that transistor. This condition is indicated in FIG. 3 for an output voltage and current above Vsat and Isat, respectively. For gate-source voltages below the threshold voltage the current is less, as indicated by Vlow and Ilow. With a low Vdd that may not be much greater than V0, the current source 10 may operate in an unsaturated mode that amplifies a positive input data swing more than an equal magnitude negative input data swing. Other factors affecting whether current source 10 operates in a saturated mode include the structure of transistor 30 and temperature of its operation, both of which may be impractical to change.

SUMMARY

In accordance with the present invention, a differential amplifier is provided having an unequal resistance in its legs that compensates for an unequal current flow through the legs during a logic zero data input compared to logic one data input. The unequal resistance may be provided by adding a resistor in parallel to the leg that carries greater current during amplification, lowering the resistance in that leg and also the voltage that is output from that leg. Alternatively, a variable resistance may be provided to at least one of the legs to compensate for current inequalities between the legs. The variable resistance may be provided by a transistor that is controlled by a signal indicating process, voltage and/or temperature conditions of the amplifier and adjacent circuitry. Transistors may be employed in both legs as well as in a current source for the amplifier, providing balanced current regulation for the amplifier. Such current compensated differential amplifiers may be employed for various functions, for example as input receivers or delay elements in high frequency memory systems.

DESCRIPTION OF THE PREFERRED EMBODIMENT

Figure 1:
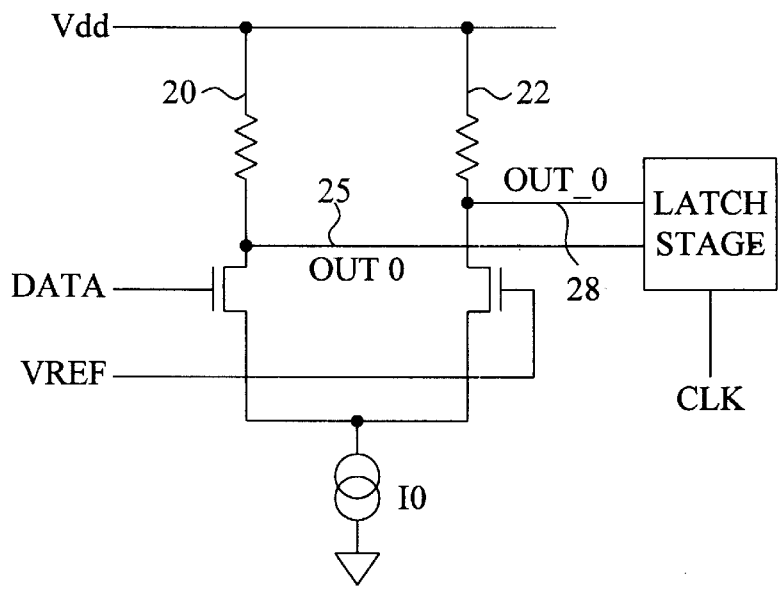
FIG. 1 is a diagram of a differential amplifier that may be used as an input receiver.
Figure 2:
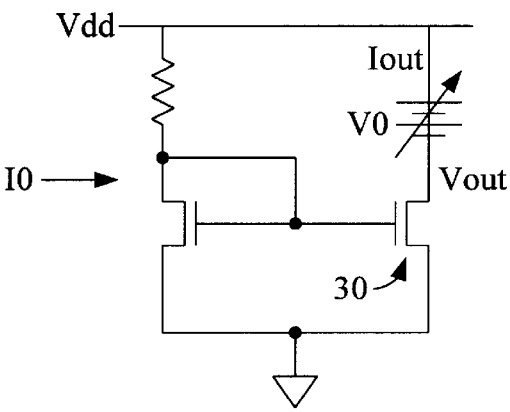
FIG. 2 is a diagram of a current source used in the differential amplifier of FIG. 1.
Figure 3:
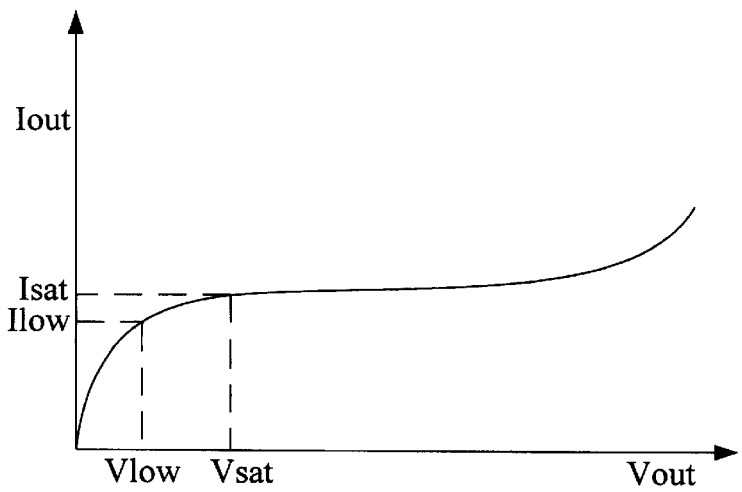
FIG. 3 is a plot of the voltage-current characteristics of the current source shown in FIG. 2.
Figure 4:
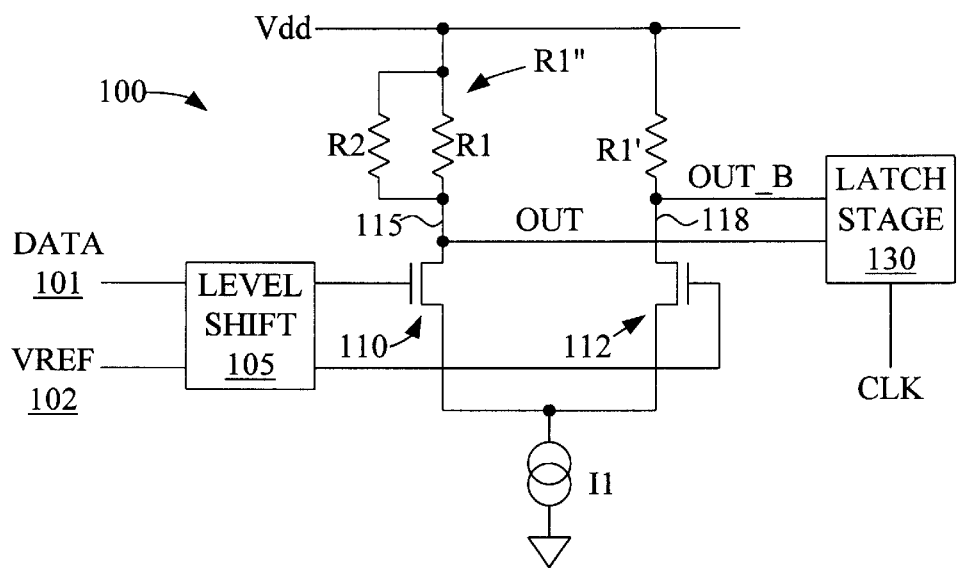
FIG. 4 is a diagram of an input receiver embodiment of a differential amplifier in accordance with the present invention.

FIG. 4 shows an embodiment of an input receiver 100 accordance with the present invention that receives a data signal DATA 101 and reference signal VREF 102. The data signal and reference signal may pass through an optional conventional level shift 105 that shifts the voltage level of both signals 101 and 102 to levels appropriate for the input receiver. Data signal 101 is then provided to transistor 110 and reference signal 102 is provided to transistor 112, the transistors matched as a differential pair. Also matched are a pair of resistors R1 and R1' that separate transistors 110 and 112 from voltage source Vdd, so that a first electrical path through first transistor 110 and first resistor R1 is equivalent to a second electrical path through second transistor 112 and second resistor R2. In one embodiment, Vdd may be in a range between about 1.0 V and 2.5 V, although lower or higher voltages may be employed. The sources of transistors 110 and 112 are interconnected and coupled to a current source I1. This configuration amplifies the voltage difference between the gates of transistors 110 and 112. I1 may be a conventional current source similar to I0 or may include bias features that will be described below. At the high frequencies in which the receiver 100 may operate, typically several hundred megahertz to about one gigaheirz, current source I1 also provides amplification for the current of data signal 101, compared to reference signal 102 which may be essentially constant in voltage and therefore provide no current. Output line OUT is connected to first electrical path 115 and output line OUT_B is connected to second electrical path 118, with OUT and OUT_B provided to a latch stage 130, where the differential output signals are referenced to a clock signal CLK. A single output may alternatively be provided.

Figure 5:
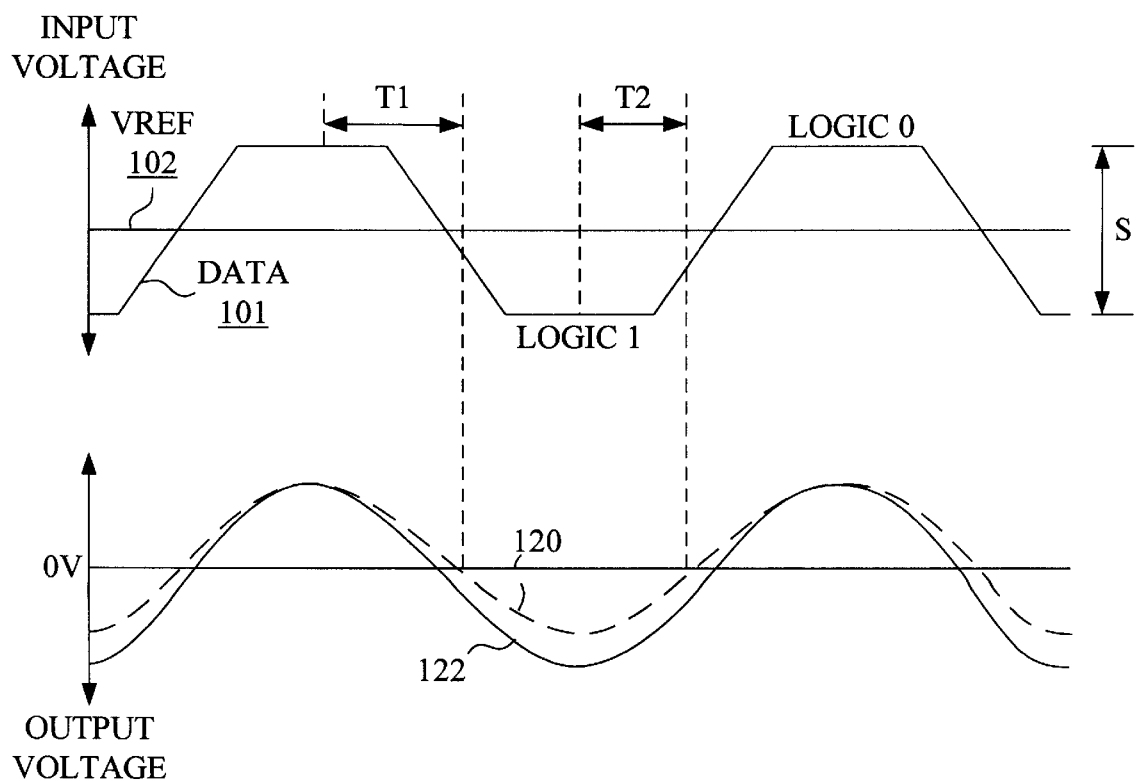
FIG. 5 is a plot of input data signals and output data signals for the differential amplifier of FIG. 4, showing the effect of compensation for an imperfect current source.

FIG. 5 shows data signal DATA 101 varying about reference signal VREF 102. Both data signal DATA 101 and reference signal VREF 102 may depart from the form and voltage levels illustrated FIG. 5. Data signal DATA 101 may have a total voltage swing S of less than 2 volts that is centered about an essentially constant reference signal VREF 102. For example, Vdd may be 1.8 V, VREF 102 may be 1.4 V, and DATA 101 may have high (LOGIC 0) and low (LOGIC 1) voltages spread equally about VREF with a total swing S of 0.8 V. At low Vdd levels, current source I1 may be saturated for positive relative data voltages but not saturated for negative relative data voltages, or may operate primarily in an unsaturated mode. Thus the voltage gain through the first electrical path 115 would be greater than that through the second electrical path 118, as shown by output signal 120. The imbalance in gain causes timing difficulties as well, as shown by the difference in time T1 for positive output voltage versus time T2 for negative output voltage.

To compensate for this greater current flowing through path 115 than path 118, an additional resistor R2 is provided in parallel with resistor R1, lowering the overall resistance R1" through path 115. As is well known, R1"=R1R2/(R1+R2). The resistor R2 is chosen so that a ratio of the resistance R1" of path 115 compared to the resistance R1' through path 118 is essentially equal to a ratio of the current through path 118 to the current though path 115 at common operating levels. Stated differently, $R1"I_{115}=R1'I_{118}$, where $I_{115}$ is the current through leg 115 during LOGIC 0 and $I_{118}$ is the current through leg 118 during LOGIC 1. Output signal 122 shows the result of this compensation of unbalanced currents with unequal resistances to produce a symmetric voltage output. Output signal 122 includes a slight optional increase in gain to compensate for reductions in voltage caused by either the unsaturated current source or lessened resistance, as described below. Instead of providing a second resistor in parallel to path 115, a second resistor could be provided in series to path 118, increasing the resistance in path 118 to compensate for lower relative current through that path.

Figure 6:
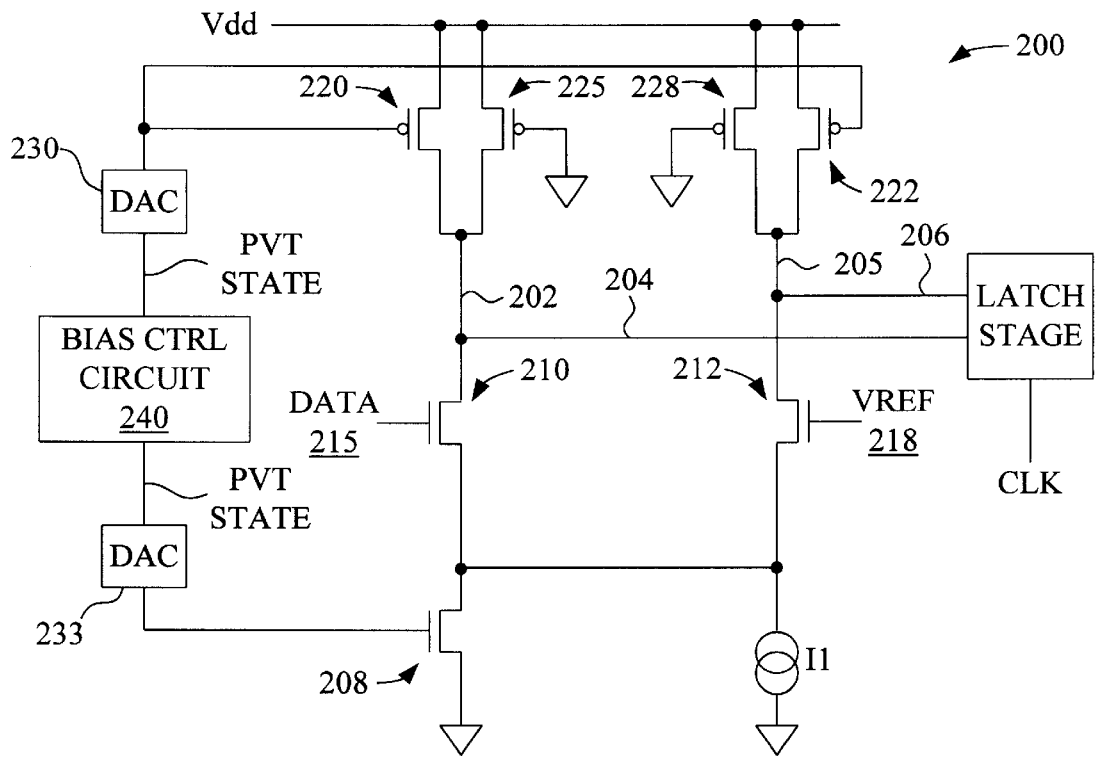
FIG. 6 is a diagram of a differential amplifier having a variable current element disposed in several optional locations.

FIG. 6 shows an embodiment of a differential amplifier 200 with an adjustable current flow through legs 202 and 205 and a current source I1 that can be adjusted with transistor 208. Much as described above, differential pair transistors 212 and 210 respectively receive a reference signal VREF 218 and a data signal DATA 215 that varies about the reference signal. Transistors 212 and 210 are source-coupled and connected to current source I1 at one end of legs 202 and 205, and a voltage source Vdd is independently connected 202 and 205 at an opposite end. Also connected to the sources of transistors 210 and 212 is NMOS transistor 208, providing a variable conductance to ground that acts as a variable current source. Vdd may be about 2 V or less, and the data signal may swing about the reference voltage by about 1 V. Output line 204 is connected to path 202 and output line 206 is connected to path 205. Grounded PMOS transistors 225 and 228 have channels that form part of electrical paths 202 and 205, respectively. PMOS transistors 220 and 222 are supplied with a bias voltage that can be varied to adjust the current in paths 202 and 205. In addition to or in place of transistors 225 and 228, resistors may be disposed in paths 202 and 205 between transistors 210 and 212 and voltage source Vdd.

The conductance of transistors 208, 220 and 222 may be controlled to compensate for conditions that would otherwise vary the speed for which output signals are provided to the latch stage. For example, the level of voltage Vdd can vary the speed of amplifier 200, with higher voltages corresponding to higher speeds and lower voltages corresponding to lower speeds. Conversely, higher temperatures generally slow the amplifier and lower temperatures raise its speeds. Processing conditions during formation of the amplifier, such as channel lengths and widths and doping concentrations also affect amplifier performance. Controlling current through transistors 208, 220 and 222 can also reduce power consumption by providing higher power only when it is needed for higher gain.

In the embodiment shown in FIG. 6, conventional digital analog converters DAC 230 and DAC 233 provide analog signals to respective transistors 208, 220 and 222 upon receiving a digital signal from bias control circuit 240 indicative of process, voltage and temperature (PVT) conditions of the circuit 200 and surrounding circuits. DAC 230 and DAC 233 may provide different analog signals upon receiving the same PVT state signal from bias control circuit 240, so that the resistance of transistors 220, 222 and 225 can be independently controlled. An advantage of this mechanism for controlling bias signals is that a digital signal indicating PVT conditions can be easily sent uncorrupted to various locations throughout a chip to control various differential amplifiers.

Figure 7:
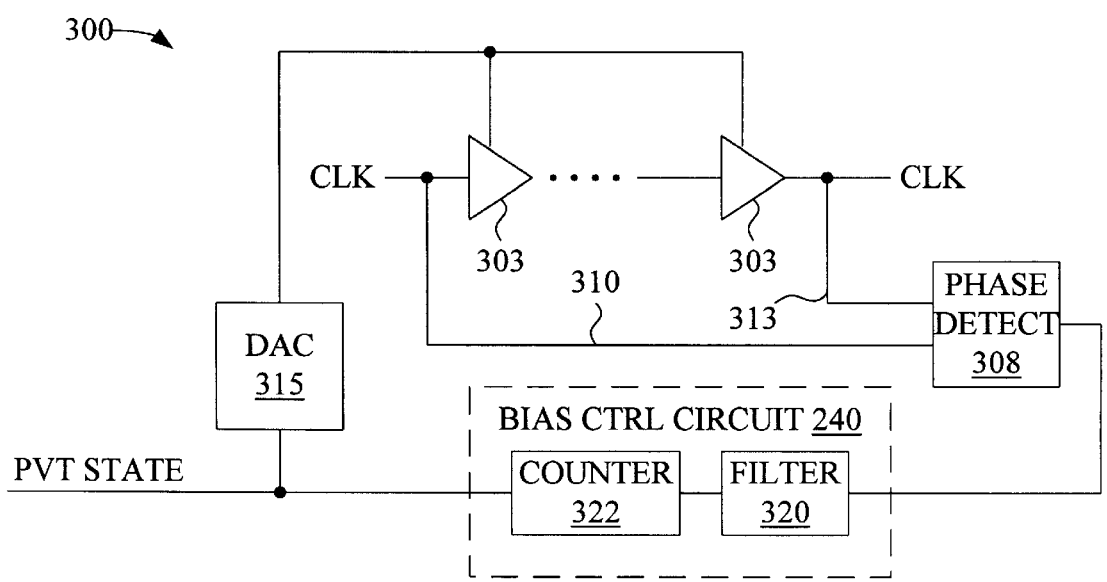
FIG. 7 is a diagram of a delay locked loop including a plurality of delay elements and control logic that generates signals that may be used to bias the variable resistance elements of FIG. 6.

As shown in FIG. 7, bias control circuit 240 may be part of a DLL circuit 300, such as that disclosed in U.S. patent application Ser. No. 6,125,157, entitled "Delay Locked Loop Circuitry for Clock Delay Adjustment," filed Feb. 6, 1997 and incorporated by reference herein. The DLL 300 includes at least one and preferably a number of adjustable delay elements 303 arranged in a series to provide a desired delay, for instance 180° or 360°, to a clock signal CLK. Delay elements 303 may each have dual inputs and outputs, which are shown in FIG. 7 as single inputs and outputs for clarity. A conventional phase detector 308 detects a phase difference between the clock signal and the delayed clock signal via lines 310 and 313.

The output from the phase detector 308 is provided to bias control circuit 240, which determines whether an increase or decrease in the delay provided by delay elements 303 is needed to achieve the desired overall delay. To do this, the bias control circuit 240 creates a digital state that is based on the phase detection signal and therefore reflective of PVT conditions, and provides that PVT state to digital analog converter DAC 315. Bias control circuit 240 contains an optional filter 320 connected to a counter 322 that is incremented or decremented depending upon the output of the phase detector 308. The filter 320, which may be a conventional digital filter, reduces oscillations about the desired phase delay. DAC 315 inputs the digital state and outputs a bias voltage to the delay elements 303, which each may adjust their delay based upon the bias voltage. DAC 230 and DAC 233 may use the same signal from bias control circuit 240 to bias transistors 208, 220 and 222 and thereby balance the gain of amplifier 200. Besides a phase detection mechanism, other bias control circuits may alternatively be employed that utilize, for example, voltage or temperature conditions for controlling differential amplifier load balancing elements such as transistors 220, 222 and 225.

Figure 8:
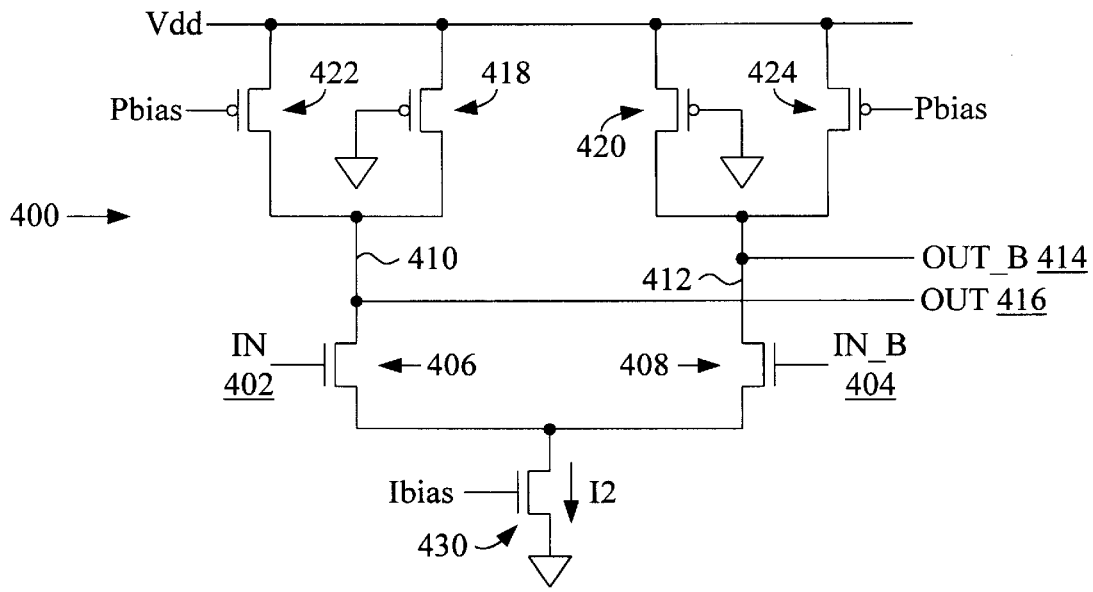
FIG. 8 is a diagram of a delay element of FIG. 7 having a variable delay regulated by the control logic of FIG. 7.

FIG. 8 shows an embodiment of a differential amplifier 400 that may be employed, for instance, as delay element 303. In this embodiment, complimentary input signals are provided to inputs IN 402 and IN_B 404 of differential pair 406 and 408. Differential pair 406 and 408 are disposed on a first electrical path 410 and a second electrical path 412, respectively. Output lines OUT 414 and OUT_B 416 are connected to paths 410 and 412, providing complimentary output signals. P-type transistors 418 and 420 are disposed on paths 410 and 412, their gates grounded to provide primarily conductive channels for the paths 410 and 412. P-type transistors 422 and 424 are disposed in parallel with transistors 418 and 420, respectively, transistors 422 and 424 each receiving a bias signal Pbias to control the loads in paths 410 and 412. Transistor 430 acts as a current source 12 for the differential amplifier 400, and is controlled by bias signal Ibias. Signals Pbias and Ibias may be generated by mechanisms that determine relevant operating conditions for the amplifier, such as voltage levels, temperature, and transistor characteristics. As described above, signals Pbias and Ibias may be generated by control logic interpreting a phase detector to produce a digital signal indicating PVT conditions, the digital signal then converted by DACs to the signals Pbias and Ibias.

Figure 9:
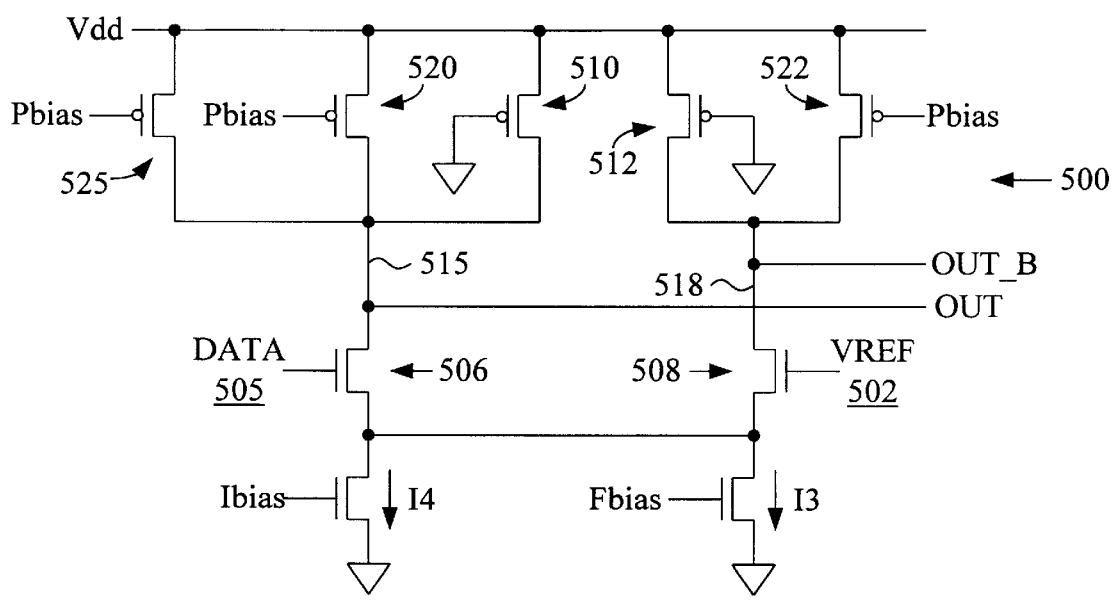
FIG. 9 is a diagram of a differential amplifier having an adjustable resistance and gain.

In FIG. 9 an embodiment of a differential amplifier 500 is shown that may be used as an input receiver, similar to amplifier 100. Much as above, a reference signal VREF 502 and a data signal DATA 505 are provided to input transistors 508 and 506, the transistors matched as a differential pair. Also matched are a pair of P-type transistors 510 and 512 having gates set to a low voltage or grounded so that their channels are primarily conductive. Transistors 506 and 510 form part of a first electrical path 515 and transistors 508 and 512 form part of a second electrical path 518. In parallel with transistor 510 is an optional P-type transistor 520, and in parallel with transistor 512 is an optional P-type transistor 522. Transistors 520 and 522 are matched and receive a bias voltage Pbias that lowers the resistance through respective electrical paths 515 and 518.

An additional P-type transistor 525 is disposed in parallel with transistors 510 and 520, transistor 525 also controlled by bias signal Pbias. Transistor 525 regulates the resistance of path 515 compared to path 518. Output line OUT is connected to first electrical path 515 and output line OUT_B is connected to second electrical path 518, the output lines reflecting voltage drops from voltage source Vdd in paths 515 and 518.

The sources of transistors 506 and 508 are interconnected and coupled to current source I3, which receives a fixed bias Fbias, and to current source I4, which receives an adjustable bias Ibias. Current source I4 regulates the current flowing through amplifier 500, affecting the gain of both outputs equally. Thus amplifier 500 can be adjusted to control both the gain of one leg relative to another and the overall gain. Similar current and resistance compensated comparitors may be used with other small voltage swing systems.

Although we have focused on teaching the preferred embodiments of a novel differential amplifier, other embodiments and modifications of this invention will be apparent to persons of ordinary skill in the art in view of these teachings. Therefore, this invention is limited only by the following claims, which include all such embodiments and modifications when viewed in conjunction with the above specification and accompanying drawings.

What is claimed is:

1. A differential amplifier comprising:
   first and second electrical paths independently connected to a voltage source and together connected to a current source,
   a first transistor having a first gate and first channel, said first path including said first channel and having a first resistance between said first channel and said voltage source, said first gate adapted to receive a reference voltage, and
   a second transistor having a second gate and second channel, said second path including said second channel and having a second resistance between said second channel and said voltage source, said second gate adapted to receive a data voltage that is variable as a positive and negative voltage relative to said reference voltage,
   wherein a positive data voltage at said second gate causes a first amount of current to flow through said second path, and a negative data voltage at said second gate, said negative data voltage having an equal magnitude as said positive data voltage, causes a second amount of current to flow through said first path, said first and second amounts of current being different such that a ratio of said first amount of current to said second amount of current is substantially equal to a ratio of said second resistance to said first resistance.

2. The differential amplifier of claim 1, wherein one of said resistances includes a plurality of resistors in parallel.

3. The differential amplifier of claim 1, wherein said first and second resistances have substantially matched resistors, and one of said resistances has a resistor in parallel with one of said matched resistors.

4. The differential amplifier of claim 1, wherein at least one of said resistances is adjustable.

5. The differential amplifier of claim 4, wherein at least one of said resistances varies in response to a phase detection mechanism.

6. The differential amplifier of claim 4, wherein at least one of said resistances varies in response to process, voltage or temperature conditions.

7. The differential amplifier of claim 1, wherein a voltage difference between said voltage source and said current source is less than about two volts.

8. The differential amplifier of claim 1, wherein said current source operates in an unsaturated mode.

9. The differential amplifier of claim 1, wherein at least one of said transistors is a field effect transistor.

10. The differential amplifier of claim 1, wherein said current source provides an adjustable quantity of current to said paths.

11. The differential amplifier of claim 1, connected as an input receiver in a memory unit.

12. A differential amplifier connectable to a voltage source, the differential amplifier comprising:
  a reference input for receiving a reference voltage,
  a data input for receiving a data voltage that is variable about said reference voltage as a positive potential difference and a negative potential difference from said reference voltage,
  a current source providing current for amplification of said data voltage via a pair of resistive paths, said current being different for equal magnitude positive and negative potential differences, and
  an output connected to at least one of said paths,
  wherein a resistance of said paths is unequal in compensation for said different current, such that amplifications of said equal magnitude positive and negative potential differences are substantially equal.

13. The differential amplifier of claim 12, wherein one of said paths includes a plurality of resistors in parallel.

14. The differential amplifier of claim 12, wherein said paths have substantially matched resistors, and one of said paths has a resistor in parallel with one of said matched resistors.

15. The differential amplifier of claim 12, wherein said resistance is adjustable.

16. The differential amplifier of claim 12, wherein said resistance is adjustable in response to process, voltage or temperature conditions.

17. The differential amplifier of claim 12, wherein said resistance is controlled by a signal generated in response to a phase detection mechanism.

18. The differential amplifier of claim 12, wherein said equal magnitude positive and negative relative voltages are less than one volt.

19. The differential amplifier of claim 12, wherein said current corresponding to said negative potential difference is less than a saturation current of said current source.

20. The differential amplifier of claim 12, wherein said current source has an adjustable current.

21. A differential amplifier comprising:
  a first electrical path having a first resistance and a second electrical path having a second resistance, said first and second paths connected to a voltage source,
  a first transistor having a first gate and being connected between said first path and a current source,
  a second transistor having a second gate and being connected between said second path and said current source,
  an output connected to said first path adjacent said first transistor,
  a first input adapted to receive a first input voltage, said first input connected to said first gate, and
  a second input adapted to receive a second input voltage, said second input connected to said second gate, said second input voltage variable compared to said first input voltage as a positive and a negative relative voltage, said positive relative voltage generating a current through said second path and said negative relative voltage generating a current through said first path, said currents through said first and second paths being unequal for equal magnitude positive and negative relative voltages, wherein a ratio of said first resistance to said second resistance compensates for said unequal currents such that an output voltage gain is substantially equal for said equal magnitude positive and negative relative voltages.

22. A differential amplifier comprising:
  a first electrical path having a first resistance and a second electrical path having a second resistance, said first and second paths connectable in parallel between a voltage source and a current source,
  a reference input having means for receiving a reference voltage and thereby regulating a current flow in said first path,
  a data input having means for receiving a data voltage and thereby regulating a current flow in said second path, said data voltage varying between a positive and a negative voltage in comparison with said reference voltage, wherein said positive voltage generates a first current through one of said paths and said negative voltage generates a second current through the other of said paths, said first and second currents being different for equal magnitude positive and negative voltages, and
  means for compensating for said different first and second currents such that an output voltage gain is substantially equal for said equal magnitude positive and negative relative voltages.

23. A differential amplifier comprising:
  a first transistor having a first gate adapted to receive a first input voltage, said first transistor having a first drain connected to a first electrical path and having a first source connected to a current source, said first electrical path having a variable first resistance separating said drain from a voltage source, and
  a second transistor having a second gate adapted to receive a second input voltage, said second transistor having a second drain connected to a second electrical path and having a second source connected to said current source and to said first source, said second electrical path having a variable second resistance separating said second drain from said voltage source,
  wherein said current source provides a variable current to said first and second paths, and said variable first and second resistances compensate for said variable current to provide a balanced output.

24. The differential amplifier of claim 23, wherein said first resistance is different than said second resistance.

25. A method for amplifying signals with a differential amplifier connected between a voltage source and a current source, the method comprising:
  providing a first voltage to a first input of the amplifier,
  providing a second voltage to a second input of the amplifier, said second voltage differing from said first voltage as a positive or negative relative voltage, such that positive and negative relative voltages of equal magnitude cause unequal amounts of current to flow through the amplifier, and
  compensating for said unequal amounts of current by providing unequal resistances to the amplifier, such the product of said unequal amounts of current and said unequal resistances yields a substantially equal voltage amplification for said positive and negative relative voltages.

26. The method of claim 25, wherein said providing different resistances includes providing a plurality of resistors in parallel to the amplifier.

27. The method of claim 25, wherein providing unequal resistances to the amplifier includes detecting a process, voltage or temperature condition of the amplifier, and providing a signal to the amplifier based upon said detecting.

28. The method of claim 25, further comprising receiving at the amplifier a signal from a phase adjustment circuit and thereby regulating at least one of said resistances.

29. The method of claim 25, wherein at least one of said unequal amounts of current is less than a saturation current of the current source.

* * * * *